United States Patent
Abeno et al.

[19]

[11] Patent Number: 5,844,449
[45] Date of Patent: Dec. 1, 1998

[54] GILBERT CELL PHASE MODULATOR HAVING TWO OUTPUTS COMBINED IN A BALUN

[75] Inventors: Ichiro Abeno; Hideki Ikuta, both of Kawasaki, Japan

[73] Assignee: Fujitsu Limited, Kanagawa, Japan

[21] Appl. No.: 925,410

[22] Filed: Sep. 8, 1997

[30] Foreign Application Priority Data

Mar. 5, 1997 [JP] Japan ................................... 9-050375

[51] Int. Cl.⁶ .............................. H03C 3/00; H04L 27/36
[52] U.S. Cl. ......................... 332/105; 332/146; 375/302; 455/110; 455/111
[58] Field of Search ...................................... 332/103, 105, 332/144, 146; 375/302, 308; 455/110, 111

[56] References Cited

U.S. PATENT DOCUMENTS

| | | | |
|---|---|---|---|
| 5,396,196 | 3/1995 | Blodgett | 332/103 |
| 5,515,014 | 5/1996 | Troutman | 332/146 |
| 5,574,755 | 11/1996 | Persico | 332/103 |

Primary Examiner—Siegfried H. Grimm
Attorney, Agent, or Firm—Helfgott & Karas, P C.

[57] ABSTRACT

A phase modulator having a Gilbert cell mixer can be used in frequency ranges from a microwave frequency band of several GHz to a millimeter wave band of several 10 GHz. Two output signals Vout1, Vout2 from the Gilbert cell mixer are supplied to balanced input terminals of a balanced-to-unbalanced converter, which produces a phase-modulated output signal Vout from an unbalanced output terminal thereof. Even when a differential amplifier comprising FETs Q1, Q3 and a differential amplifier comprising FETs Q2, Q4 do not operate symmetrically, the phase modulator generates phase-modulated output signals that have the same amplitude as each other and are in opposite phase to each other. With the Gilbert cell mixer comprising FETs, the phase modulator can be used in the frequency ranges described above. If the balanced-to-unbalanced converter is in the form of a planar circuit, then the phase modulator may be implemented by an MMIC.

14 Claims, 18 Drawing Sheets

FIG. 17 (A) Vout 1
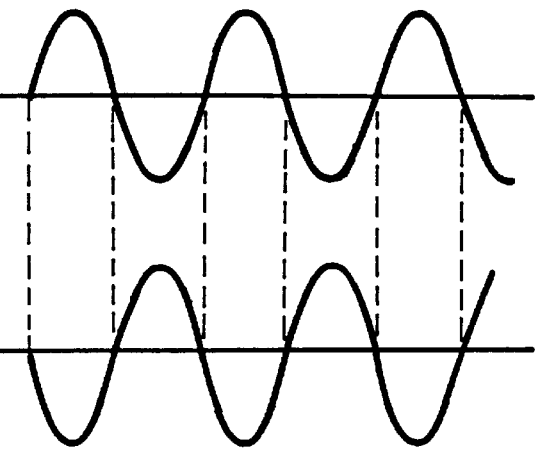
FIG. 17 (B) Vout 2
FIG. 17 (C)

GILBERT CELL PHASE MODULATOR HAVING TWO OUTPUTS COMBINED IN A BALUN

BACKGROUND OF THE INVENTION (1) Field of the Invention

The present invention relates to a phase modulator, and more particularly to a phase modulator for use in frequency ranges from a microwave frequency band of several GHz to a millimeter wave band of several 10 GHz, the phase modulator comprising an MMIC (Monolithic Microwave Integrated Circuit).

(2) Description of the Related Art

Base stations for mobile communications are usually interconnected by optical cables. In situations where optical cables cannot be laid between base stations, the base stations are interconnected by radio communications. For such radio communications, frequency ranges from a microwave frequency band of several GHz to a millimeter wave band of several 10 GHz are used. Radio units for such radio communications are required to be inexpensive and small in size, and capable of operating at low voltages.

The present invention is concerned with a phase modulator that can be used in such radio units.

FIG. 13 of the accompanying drawings shows a Gilbert cell mixer which is used mainly in a conventional phase modulator. As shown in FIG. 13, the Gilbert cell mixer includes a differential amplifier having field-effect transistors (hereinafter referred to as "FET") Q11, Q12 whose sources are connected to an FET Q13 and a differential amplifier having FETs Q14, Q15 whose sources are connected to an FET Q16. The FETs Q11, Q15 have gates connected to a terminal 101 to which a carrier signal LO is applied. The FETs Q12, Q14 have gates AC-coupled to ground. The FET Q13 has a gate connected to a terminal 102 to which a baseband signal BB is applied. The FET Q16 has a gate connected to a terminal 103 to which a reversal of the baseband signal BB is applied. The FETs Q13, Q16 have respective sources connected to a constant-current power supply 104. While a bias voltage applied to each of the FETs is omitted from illustration in FIG. 13, a negative offset voltage is actually applied as a gate bias voltage to the gates of the FETs Q13, Q16, for example.

The FET Q14 has a drain connected to the drain of the FET Q11, which is connected to a terminal 105 that produces an output signal Vout1. Similarly, the FET Q12 has a drain connected to the drain of the FET Q15, which is connected to a terminal 106 that produces an output signal Vout2.

FIGS. 14 and 15 of the accompanying drawings illustrate the manner in which the Gilbert cell mixer operates. When the baseband signal BB, which is of a sine wave, is positive (when the voltage at the terminal 102 is greater than the offset voltage and the voltage at the terminal 103 is smaller than the offset voltage), the FET Q13 is turned on and the FET Q16 is turned off. At this time, the FETs Q14, Q15 do not operate. Such a state of operation is shown in FIG. 14. When the baseband signal BB is negative (when the voltage at the terminal 103 is greater than the offset voltage and the voltage at the terminal 102 is smaller than the offset voltage), the FET Q16 is turned on and the FET Q13 is turned off. At this time, the FETs Q11, Q12 do not operate. Such a state of operation is shown in FIG. 15.

A comparison of FIGS. 14 and 15 indicates that a signal outputted from the terminal 105 when the baseband signal BB is positive and a signal outputted from the terminal 105 when the baseband signal BB is negative have the same amplitude as and are in opposite phase to the same carrier signal LO that is applied to the terminal 101. Specifically, the output signal Vout1 has the same amplitude as the carrier signal LO, but is reversed in phase depending on whether the baseband signal BB is positive or negative. The carrier signal LO is thus phase-modulated.

The same holds true for the output signal Vout2. Either the output signal Vout1 or the output signal Vout2 may be used as a modulated output signal.

The Gilbert cell mixer of the above circuit arrangement is suitable for being implemented by an MMIC.

When the carrier signal LO has a high frequency of several GHz or higher, however, each of the FETs suffers stray capacitance and is subject to characteristic changes such as complexed input/output impedance, resulting in the failure of the differential amplifier to operate symmetrically. Consequently, the Gilbert cell mixer fails to operate normally as the phase modulator. Such problems will be described below with reference to FIGS. 16 through 18 of the accompanying drawings.

FIG. 16 shows only a circuit portion of the Gilbert cell mixer which operates when the baseband signal BB is positive. The FET Q13 that operates as a switching transistor is omitted from illustration.

When the frequency of the carrier signal LO is lower than several GHz, the FETs Q11, A12 operate as a differential amplifier. As a result, if the output signal Vout1 is a signal as shown in FIG. 17(A) of the accompanying drawings, then the output signal Vout2 is a signal as shown in FIG. 17(B) of the accompanying drawings. The relationship between these output signals Vout1, Vout2 is represented by vectors in FIG. 17(C) of the accompanying drawings. The vectors of the output signals Vout1, Vout2 have the same amplitude as each other, and are out of phase with each other by a phase difference of $\pi/2$.

When the frequency of the carrier signal LO is of several GHz or higher, the vectors of the output signals Vout1, Vout2 are no longer of the relationship shown in FIG. 17(C).

FIG. 18 of the accompanying drawings is a polar coordinate graph showing the specific relationship of the vectors of the output signals Vout1, Vout2 with the frequency of the carrier signal LO as a parameter. In FIG. 18, a vector 108 represents the output signal Vout2 when the frequency of the carrier signal LO is 0.1 GHz, and a vector 109 represents the output signal Vout1 when the frequency of the carrier signal LO is 0.1 GHz. The vectors 108, 109 have the same amplitude, but are out of phase with each other by a phase difference of $\pi/2$. As the carrier frequency goes higher, the vector of the output signal Vout2 moves in the direction indicated by the arrow 112. When the carrier frequency is set to 30 GHz, the vector of the output signal Vout2 becomes a vector 110. The vector of the output signal Vout1 moves in the direction indicated by the arrow 113. When the carrier frequency is set to 30 GHz, the vector of the output signal Vout1 becomes a vector 111. At the carrier frequency of 30 GHz, the vectors 110, 111 have different amplitudes, and the phase difference therebetween is no longer $\pi/2$.

This indicates that the differential amplifier made up of the FETs Q11, Q12 does not operate symmetrically. Therefore, as the carrier frequency becomes higher than 0.1 GHz, it is difficult to use the Gilbert cell mixer as a modulator.

One phase modulator that can be used at high frequencies of several GHz or higher is a ring modulator. The ring modulator comprises Schottky diodes and transformers, and cannot easily be implemented by an MMIC.

SUMMARY OF THE INVENTION

It is an object of the present invention to provide a phase modulator which can be used in frequency ranges from a microwave frequency band of several GHz to a millimeter wave band of several 10 GHz and can also be implemented by an MMIC.

To achieve the above object, there is provided a phase modulator for use in at least a microwave frequency band and a millimeter wave band. The phase modulator includes first and second FETs having respective gates for being supplied with a carrier signal, a third FET having a gate AC-coupled to ground, a drain connected to a drain of the second FET, and a source connected to a source of the first FET, a fourth FET having a gate AC-coupled to ground, a drain connected to a drain of the first FET, and a source connected to a source of the second FET, a fifth FET having a gate for being supplied with a baseband signal, a drain connected to the sources of the first and third FETs, and a source connected to ground, a sixth FET having a gate for being supplied with a reversal of the baseband signal, a drain connected to the sources of the second and fourth FETs, and a source connected to ground, and a balanced-to-unbalanced converter for shifting, by $\pi/2$, the phase of one of an output signal produced from the drain of the first FET and an output signal produced from the drain of the second FET, combining the phase-shifted signal with the other output signal, and producing a combined output signal.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 17(A) is a diagram showing an output signal Vout1 of the Gilbert cell mixer;

FIG. 17(B) is a diagram showing an output signal Vout2 of the Gilbert cell mixer;

FIG. 17(C) is a diagram showing vector representations of the output signals Vout1, Vout2.

DESCRIPTION OF THE PREFERRED EMBODIMENTS

Figure 1:
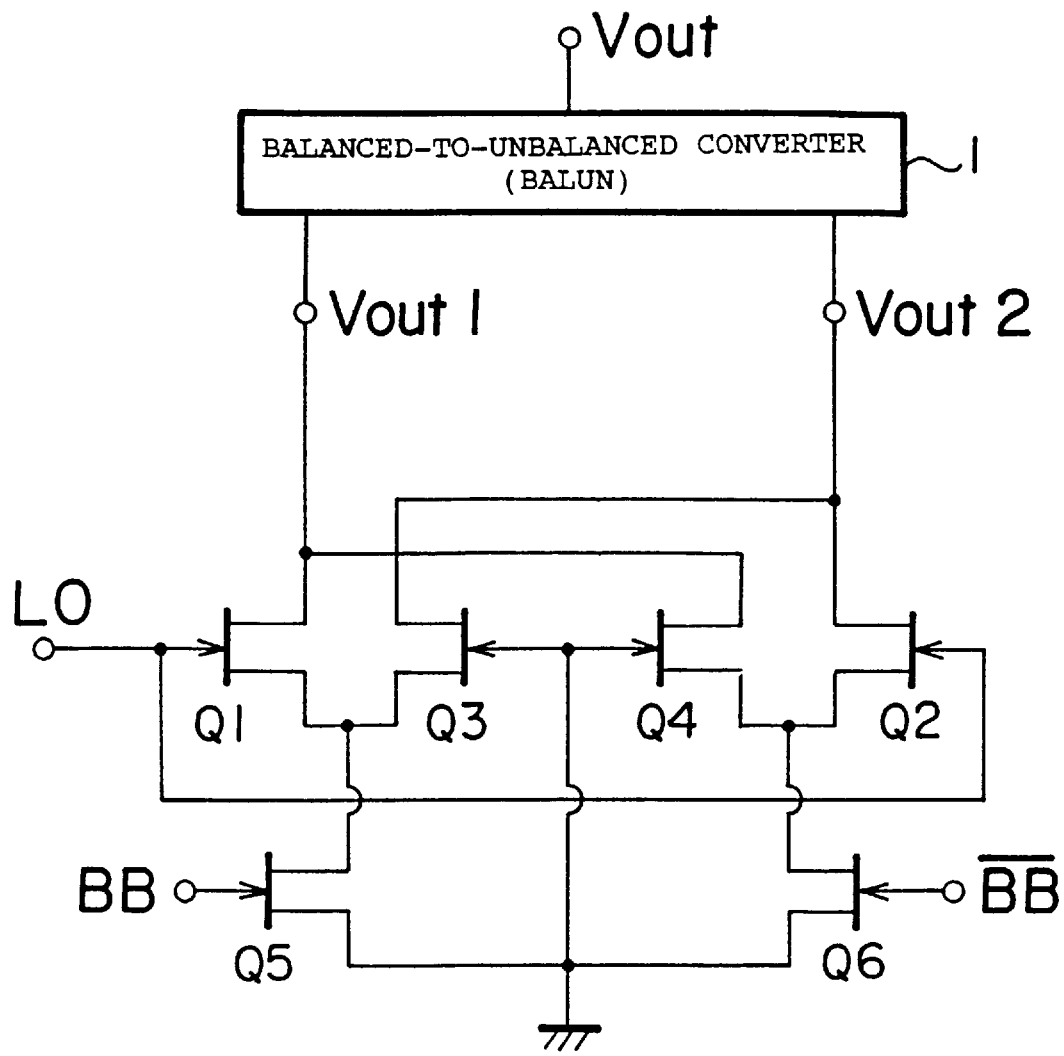
FIG. 1 is a circuit diagram illustrative of the principles of a phase modulator of a first embodiment of the present invention.

The principles of a phase modulator according to a first embodiment of the present invention will be described below with reference to FIG. 1. FIG. 1 shows the principles of the phase modulator according to the first embodiment of the present invention. In FIG. 1, a DC bias circuit is omitted from illustration, and circuit elements are illustrated from an AC signal standpoint.

As shown in FIG. 1, the phase modulator according to the first embodiment comprises first and second FETs Q1, Q2 having respective gates for being supplied with a carrier signal LO, a third FET Q3 having a gate AC-coupled to ground, a drain connected to the drain of the second FET Q2, and a source connected to the source of the first FET Q1, a fourth FET Q4 having a gate AC-coupled to ground, a drain connected to the drain of the first FET Q1, and a source connected to the source of the second FET Q2, a fifth FET Q5 having a gate for being supplied with a baseband signal BB, a drain connected to the sources of the first and third FETs Q1, Q3, and a source connected to ground, a sixth FET Q6 having a gate for being supplied with a reversal of the baseband signal BB, a drain connected to the sources of the second and fourth FETs Q2, Q4, and a source connected to ground, and a balanced-to-unbalanced converter 1 for shifting, by only $\pi/2$, the phase of one of an output signal produced by the drain of the first FET Q1 and an output signal produced by the drain of the second FET Q2, combining the phase-shifted signal with the other output signal, and producing a combined output signal.

When the phase modulator shown in FIG. 1 is used in frequency ranges from a microwave frequency band of several GHz to a millimeter wave band of several 10 GHz, each of the FETs suffers stray capacitance and the FETs Q1, Q3 and the FETs Q2, Q4, which make up respective differential amplifiers, do not operate symmetrically. Such a condition will be described below with reference to FIGS. 2(A) and 2(B). It is assumed that an output signal appearing at the drain of the first FET Q1 is represented by Vout1, an output signal appearing at the drain of the second FET Q2 is represented by Vout2, and a phase-modulated output signal Vout appearing at an unbalanced output terminal of the balanced-to-unbalanced converter 1 is represented by Vout.

Figure 2:
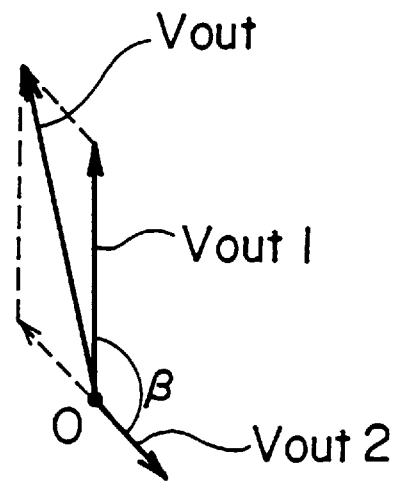
FIG. 2(A) is a diagram showing respective vectors of an output signal Vout1, an output signal Vout2, and a phase-modulated output signal Vout when a baseband signal BB is positive.
FIG. 2(B) is a diagram showing respective vectors of the output signal Vout1, the output signal Vout2, and the phase-modulated output signal Vout when the baseband signal BB is negative.
Figure 2:
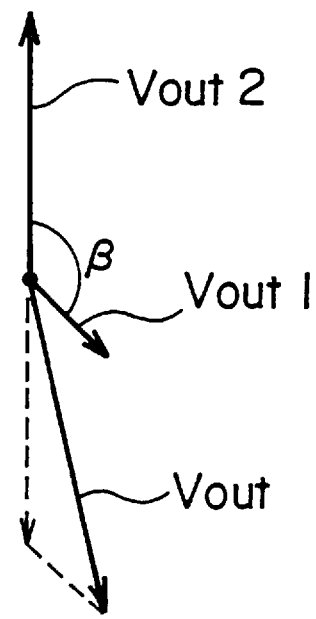

FIG. 2(A) shows respective vectors of the output signal Vout1, the output signal Vout2, and the phase-modulated output signal Vout which are produced with respect to the carrier signal LO when a baseband signal BB is positive. FIG. 2(B) shows respective vectors of the output signal Vout1, the output signal Vout2, and the phase-modulated output signal Vout which are produced with respect to the carrier signal LO when the baseband signal BB is negative. If the frequency of the carrier signal LO is set to a value in the frequency ranges from a microwave frequency band of several GHz to a millimeter wave band of several 10 GHz, then when the baseband signal BB is positive, the output signal Vout2 is out of phase with the output signal Vout1 by a phase difference of $\beta$ ($\neq \pi/2$), and has an amplitude smaller than the amplitude of the output signal Vout1, and when the baseband signal BB is negative, the output signal Vout1 is out of phase with the output signal Vout2 by the phase difference of $\beta$, and has an amplitude smaller than the amplitude of the output signal Vout2.

When the output signals Vout1, Vout2 are supplied to the balanced-to-unbalanced converter 1, the balanced-to-unbalanced converter 1 produces a phase-modulated output signal Vout expressed by the following equation (1):

$$\text{Vout} = \text{Vout1} - \text{Vout2} \qquad (1)$$

Therefore, as shown in FIGS. 2(A) and 2(B), the vector of the phase-modulated output signal Vout produced when the baseband signal BB is positive and the vector of the phase-modulated output signal Vout produced when the baseband signal BB is negative have the same amplitude as each other and are out of phase with each other by a phase difference of $\pi/2$.

With the phase modulator being used in frequency ranges from a microwave frequency band of several GHz to a millimeter wave band of several 10 GHz, even when the FETs Q1, Q3 and the FETs Q2, Q4, which make up respective differential amplifiers, do not operate symmetrically, the phase modulator is capable of producing the phase-modulated output signals Vout that have the same amplitude as each other and are out of phase with each other by a phase difference of $\pi/2$.

Since the balanced-to-unbalanced converter 1 may comprise a planar circuit, the phase modulator shown in FIG. 1 may be implemented in its entirety by an MMIC.

Inasmuch as no problem occurs when the differential amplifiers do not operate symmetrically, the phase modulator shown in FIG. 1 does not require a constant-current power supply which would otherwise be necessary to operate differential amplifiers symmetrically.

Accordingly, it is possible to provide a phase modulator which is small in size, can operate at a low power supply voltage, and can be manufactured inexpensively.

Figure 3:
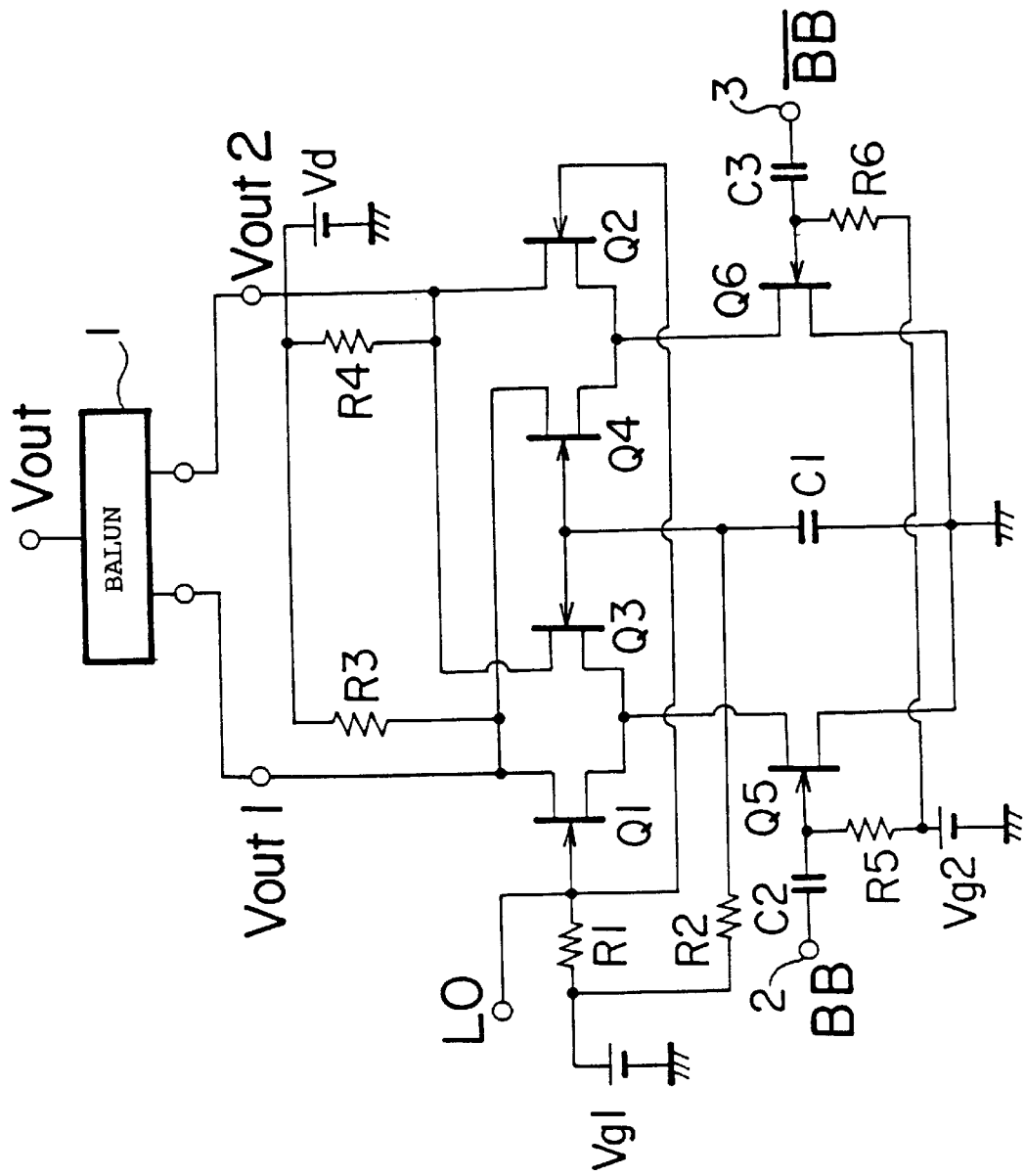
FIG. 3 is a circuit diagram of a detailed structure of the phase modulator according to the first embodiment of the present invention.

FIG. 3 shows a detailed structure of the phase modulator according to the first embodiment of the present invention. FIG. 3 additionally illustrates DC bias circuits and load circuits which are omitted from illustration in FIG. 1.

Specifically, a gate bias voltage Vg1 is applied through a resistor R1 to the gates of the FETs Q1, Q2, and the gate bias voltage Vg1 is applied through a resistor R2 to the gates of the FETs Q3, Q4. The resistors R1, R2 have the same resistance, and the gate voltage Vg1 is set to such a value that the gates of the FETs Q1, Q2 are more negative in potential than their sources by 0.5 V, for example. A negative gate bias voltage Vg2 is applied through respective resistors R5, R6 to the gates of the respective FETs Q5, Q6. A positive drain bias voltage Vd is applied through a resistor R3 to the drains of the respective FETs Q1, Q4. The positive drain bias voltage Vd is also applied through a resistor R4 to the drains of the respective FETs Q2, Q3. A terminal 2 for supplying the base signal BB is connected through a capacitor C2 to the gate of the FET Q5. A terminal 3 for supplying the reversal of the base signal BB is connected through a capacitor C3 to the gate of the FET Q6. The FETs Q3, Q4 have respective sources grounded. The resistors R3, R4 have the same resistance as each other, the resistors R5, R6 have the same resistance as each other, and the capacitors C2, C3 have the same capacitance as each other. The FETs Q1–Q4 have the same characteristics as each other, and the FETs Q5, Q6 have the same characteristics as each other.

Figure 4:
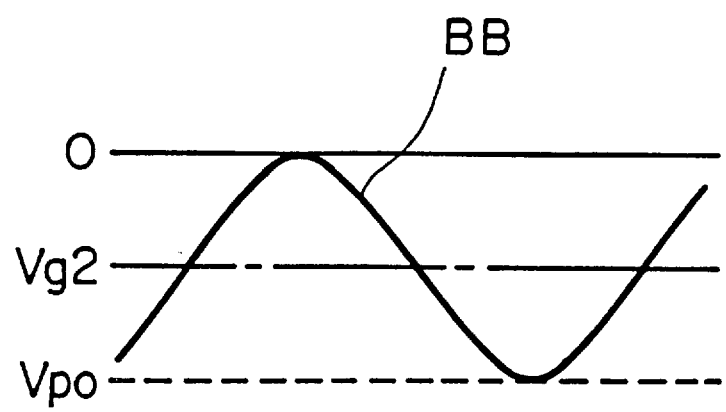
FIG. 4 is a diagram showing a DC bias voltage Vg2 and a baseband signal BB.

FIG. 4 shows the gate bias voltage Vg2 and the baseband signal BB. As shown in FIG. 4, the negative gate bias voltage Vg2 is set to about ½ of a pinch-off voltage Vpo (negative) of the FETs Q5, Q6. The amplitude of the baseband signal BB is adjusted such that it is of a value equal to or smaller than twice the absolute value of the negative gate bias voltage Vg2. With such voltage and amplitude settings, the voltages at the terminals 2, 3 fall in a range from 0 to Vpo.

Figure 5:
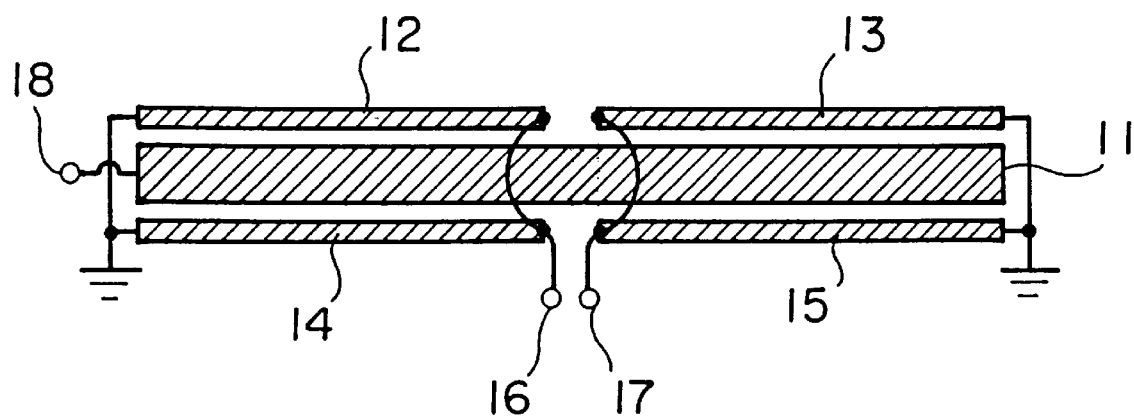
FIG. 5 is a diagram showing an internal structure of a balanced-to-unbalanced converter.

FIG. 5 shows an internal structure of the balanced-to-unbalanced converter 1. The balanced-to-unbalanced converter, which is generally called "BALUN", may comprise a planar circuit referred to as a Marchand Balun. The BALUN shown in FIG. 5 comprises a Marchand Balun.

As shown in FIG. 5, the Marchand Balun comprises a stripline 11 having a length of about $\lambda/2$ ($\lambda$ represents the wavelength of the carrier signal LO) and four striplines 12–15 disposed in sandwiching relation to the stripline 11. Each of the four striplines 12–15 has a length of about $\lambda/4$. The striplines 12, 14 have ends near the center of the Marchand Balun which are connected to a terminal 16, and the striplines 13, 15 have ends near the center of the Marchand Balun which are connected to a terminal 17. The striplines 12–15 have respective outer ends connected to ground. A terminal 18 is connected to the stripline 11. The terminal 18 serves as an unbalanced output terminal (unbalanced port) for producing the phase-modulated output signal Vout. The terminals 16, 17 serve as balanced input terminals (balanced ports) for being supplied with the output signals Vout1, Vout2, respectively.

Figure 6:
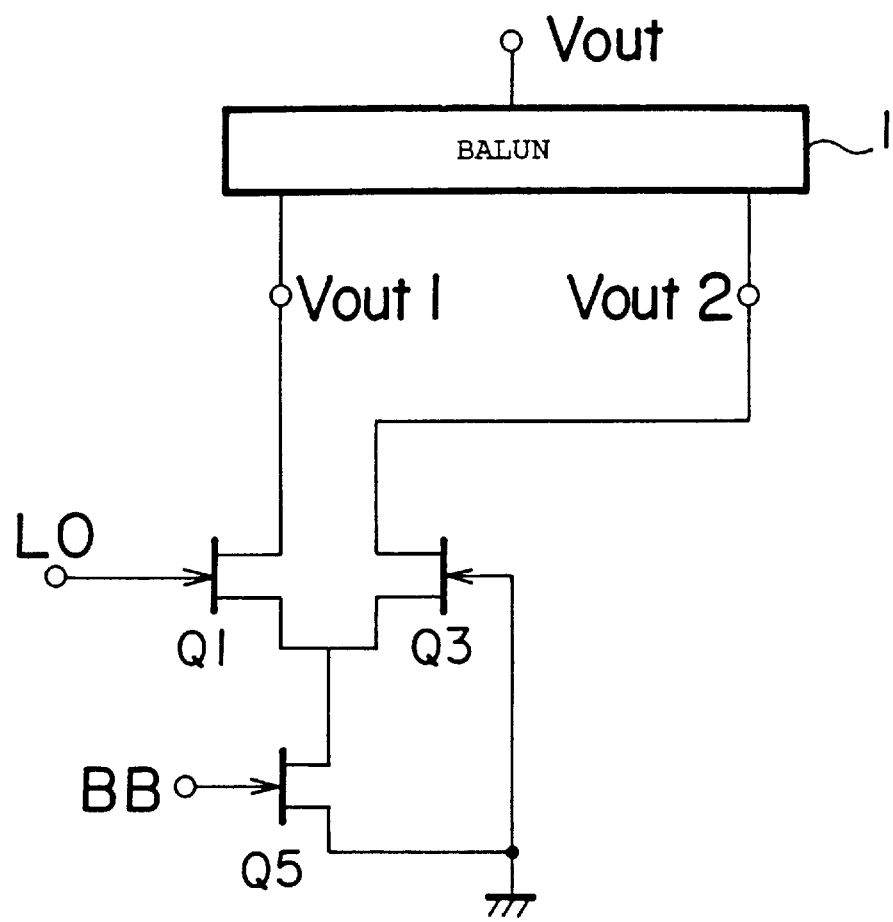
FIG. 6 is a diagram illustrative of the manner in which the phase modulator according to the first embodiment operates when a sine-wave baseband signal BB is positive.
Figure 7:
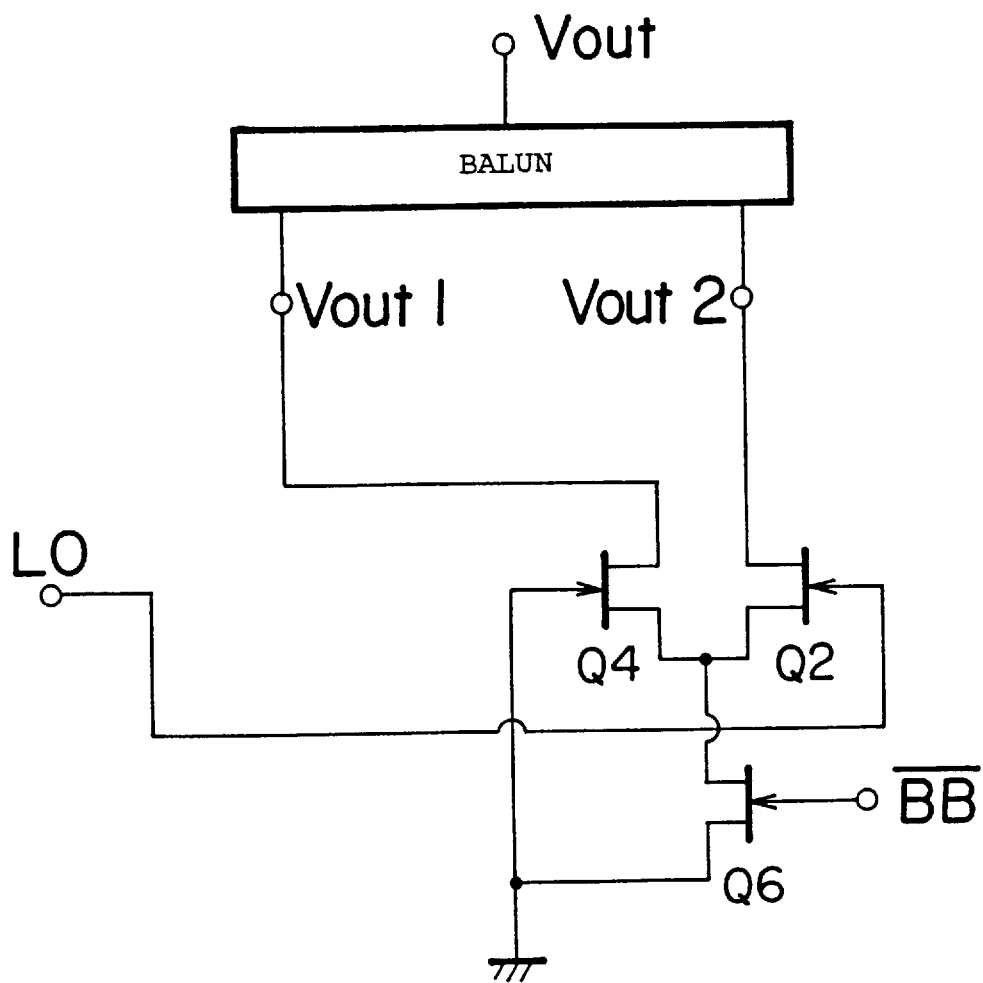
FIG. 7 is a diagram illustrative of the manner in which the phase modulator according to the first embodiment operates when the sine-wave baseband signal BB is negative.

FIGS. 6 and 7 illustrate the manner in which the phase modulator according to the first embodiment shown in FIG. 3 operates. When the sine-wave baseband signal BB is positive (when the baseband signal BB is greater than the gate bias voltage Vg2), the FET Q5 is turned on and the FET Q6 is turned off in FIG. 3. At this time, the FETs Q2, Q4 do not operate. Such a state of operation is shown in FIG. 6. When the sine-wave baseband signal BB is negative (when the baseband signal BB is smaller than the gate bias voltage Vg2), the FET Q6 is turned on and the FET Q5 is turned off. At this time, the FETs Q1, Q3 do not operate. Such a state of operation is shown in FIG. 7.

In FIG. 6, when the frequency of the carrier signal LO is set to a value in a microwave frequency band of several GHz or a millimeter wave band of several 10 GHZ, the FETs Q1, Q3, which make up a differential amplifier, suffer stray capacitance and are subject to characteristic changes, resulting in the failure of the differential amplifier to operate symmetrically. Such a condition will be described below with reference to FIG. 2(A). When the baseband signal BB is positive, the output signal Vout2 is out of phase with the output signal Vout1 by a phase difference of β (≠π/2), and has an amplitude smaller than the amplitude of the output signal Vout1. This operation is based on the phenomenon described above with reference to FIG. 18. When the baseband signal BB is negative, the output signal Vout1 is out of phase with the output signal Vout2 by the phase difference of β, and has an amplitude smaller than the amplitude of the output signal Vout2. The phase difference between the output signals Vout1, Vout2 when the baseband signal BB is positive is the same as the phase difference between the output signals Vout1, Vout2 when the baseband signal BB is negative. The amplitude difference between the output signals Vout1, Vout2 when the baseband signal BB is positive is also the same as the amplitude difference between the output signals Vout1, Vout2 when the baseband signal BB is negative. This condition manifests itself if the phase modulator is implemented by an MMIC because the characteristics of the FETs Q1–Q4 do not vary essentially.

When the output signals Vout1, Vout2 are supplied to the balanced-to-unbalanced converter 1, the balanced-to-unbalanced converter 1 produces a phase-modulated output signal Vout expressed by the following equation (1):

$$\text{Vout} = \text{Vout1} - \text{Vout2} \tag{1}$$

It is assumed that the carrier signal LO is represented by $\sin \omega t$. If the output signals Vout1, Vout2 have respective values Vout1$a$, Vout2$a$ when the baseband signal BB is positive, then the values Vout1$a$, Vout2$a$ are expressed by the respective equations (2a), (2b) as follows:

$$\text{Vout1}a = A \cdot \sin(\omega t + \alpha) \tag{2a}$$

$$\text{Vout2}a = A \cdot m \cdot \sin(\omega t + \alpha + \beta) \tag{2b}$$

where A represents the amplification factor and m a reduction in the amplitude.

Therefore, when the baseband signal BB is positive, the phase-modulated output signal Vout has a value Vouta which is expressed by the following equation (3) based on the above equation (1):

$$\text{Vouta} = A \cdot \sin(\omega t + \alpha) - A \cdot m \cdot \sin(\omega t + \alpha + \beta) \tag{3}$$

Similarly, if the output signals Vout2, Vout1 have respective values Vout2$b$, Vout1$b$ when the baseband signal BB is negative, then the values Vout2$b$, Vout1$b$ are expressed by the respective equations (4a), (4b) as follows:

$$\text{Vout2}b = A \cdot \sin(\omega t + \alpha) \tag{4a}$$

$$\text{Vout1}b = A \cdot m \cdot \sin(\omega t + \alpha + \beta) \tag{4b}$$

Therefore, when the baseband signal BB is negative, the phase-modulated output signal Vout has a value Voutb which is expressed by the following equation (5) based on the above equation (1):

$$\text{Voutb} = A \cdot m \cdot \sin(\omega t + \alpha + \beta) - A \cdot \sin(\omega t + \alpha) \tag{5}$$

From the equations (3) and (5), the following equation (6) is obtained:

$$\text{Vouta} = -\text{Voutb} \tag{6}$$

Consequently, the vector of the phase-modulated output signal Vout produced when the baseband signal BB is positive and the vector of the phase-modulated output signal Vout produced when the baseband signal BB is negative have the same amplitude as each other, and are out of phase with each other by a phase difference of π/2.

Thus, with the phase modulator being used in frequency ranges from a microwave frequency band of several GHz to a millimeter wave band of several 10 GHz, even when the FETs Q1, Q3 and the FETs Q2, Q4, which make up respective differential amplifiers, do not operate symmetrically, the phase modulator is capable of producing the phase-modulated output signals Vout that have the same amplitude as each other and are out of phase with each other by a phase difference of π/2.

Figure 8:
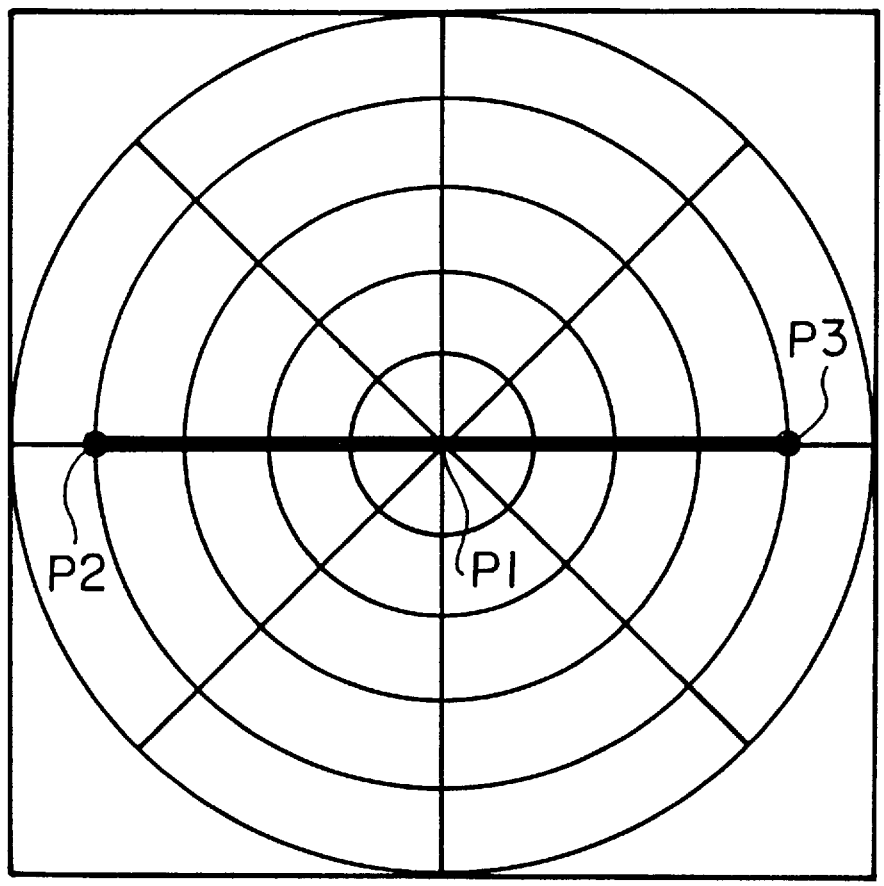
FIG. 8 is a polar coordinate diagram showing a simulated result of a phase-modulated output signal Vout of the phase modulator shown in FIG. 3.

FIG. 8 is a polar coordinate diagram showing a simulated result of the phase-modulated output signal Vout of the phase modulator shown in FIG. 3. In the simulation, the frequency of the carrier signal LO is set to 38 GHz, the drain bias voltage Vd to 5 V, the gate bias voltage Vg1 to 2 V, the load resistors R3, R4 to 300Ω, the gate bias voltage Vg2 to −0.3 V, and the amplitude of the baseband signal BB to 0.6 V. A point P1 in FIG. 8 indicates the phase-modulated output signal Vout produced when both the baseband signal BB and the reversal thereof have a voltage of −0.3 V. A point P2 in FIG. 8 indicates the phase-modulated output signal Vout produced when the baseband signal BB has a voltage of 0 V and the reversal thereof has a voltage of −0.6 V. A point P3 in FIG. 8 indicates the phase-modulated output signal Vout produced when the baseband signal BB has a voltage of −0.6 V and the reversal thereof has a voltage of 0 V. As can be seen from FIG. 8, the phase-modulated output signal Vout produced when the baseband signal BB is of 0 V and the phase-modulated output signal Vout produced when the baseband signal BB is of −0.6 V have the same amplitude as each other and are in opposite phase to each other regardless of the fact that the frequency of the carrier signal LO is set to 38 GHz.

Since the balanced-to-unbalanced converter 1 comprises a planar circuit, the phase modulator can be implemented in its entirety by an MMIC.

Figure 13:
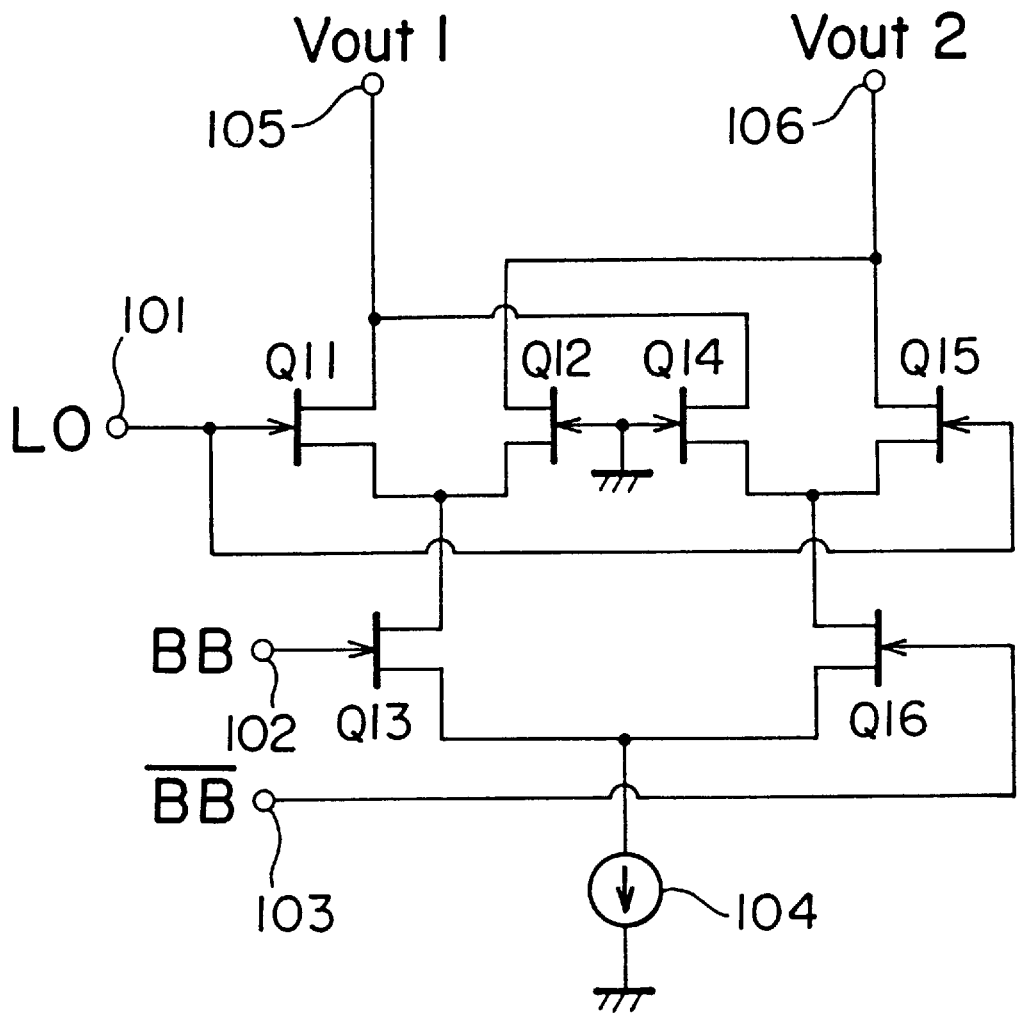
FIG. 13 is a circuit diagram of a Gilbert cell mixer used mainly in a conventional phase modulator.
Figure 14:
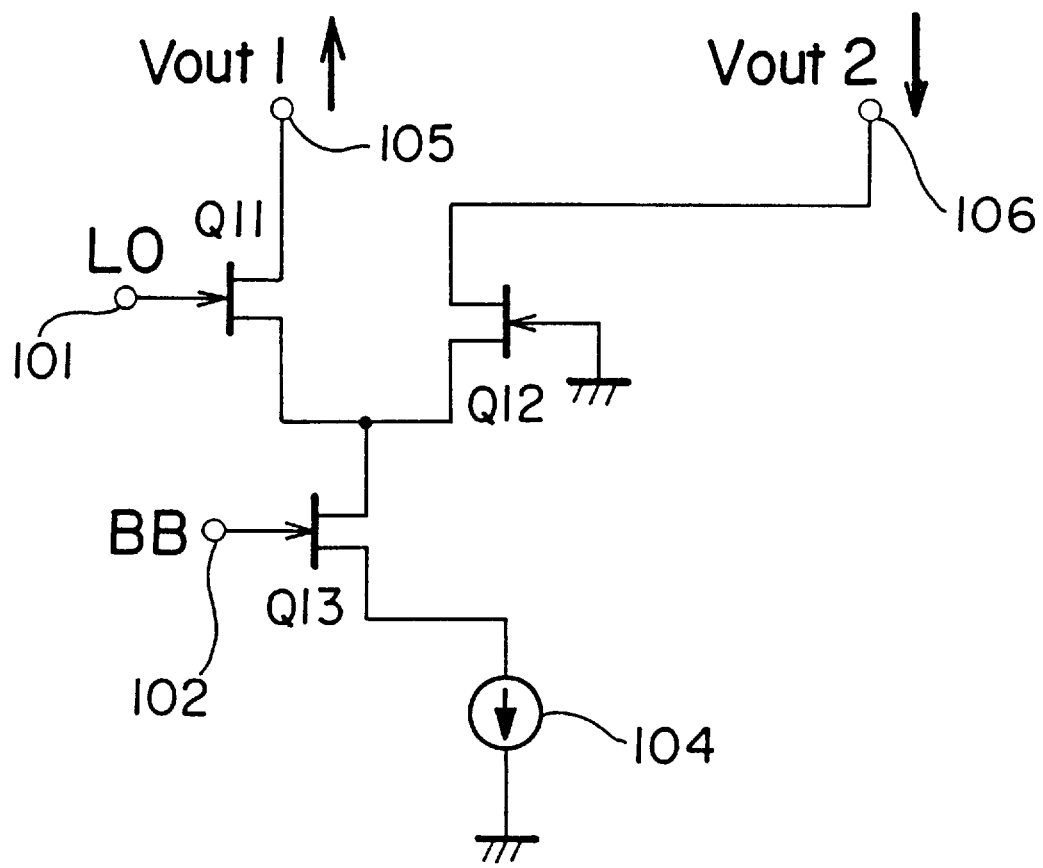
FIG. 14 is a diagram illustrative of the manner in which the Gilbert cell mixer operates when a sine-wave baseband signal BB is positive.
Figure 15:
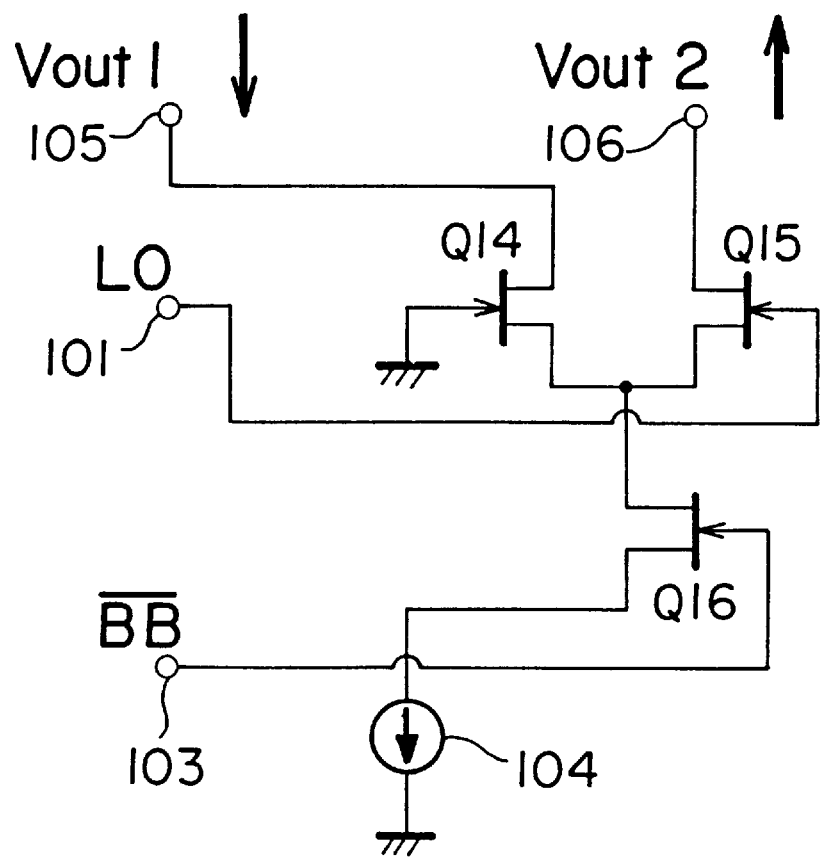
FIG. 15 is a diagram illustrative of the manner in which the Gilbert cell mixer operates when the sine-wave baseband signal BB is negative.
Figure 16:
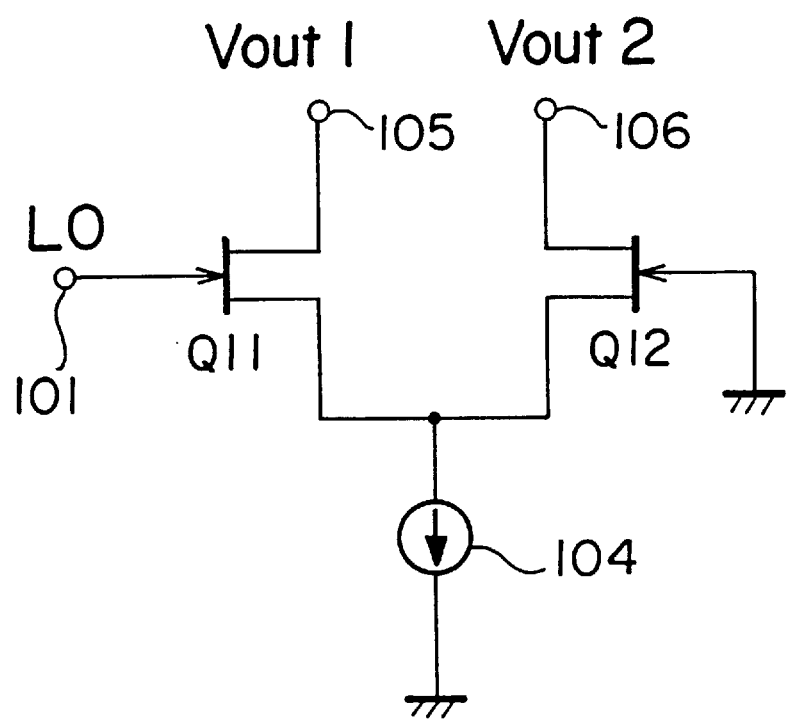
FIG. 16 is a diagram of a portion of the Gilbert cell mixer which operates when the sine-wave baseband signal BB is positive.

In the first embodiment, because no problem occurs when the differential amplifiers do not operate symmetrically, the phase modulator does not require a constant-current power supply (corresponding to the constant-current power supply 104 shown in FIG. 13) which would otherwise be necessary to operate differential amplifiers symmetrically. As no constant-current power supply is required, the power supply of the phase modulator may only supply a power supply voltage from which a voltage (of 2 V, for example) across a constant-current power supply has been reduced.

As described above, the phase modulator according to the first embodiment can operate at a low power supply voltage, and is small in size and inexpensive to manufacture if it is implemented by an MMIC.

A constant-current power supply may instead be added to the phase modulator shown in FIG. 1.

In the first embodiment, the FETs Q1–Q6 are employed. However, the FETs Q1–Q6 may be replaced with bipolar transistors. Specifically, if the phase modulator is used in a frequency range of 1–2 GHz or below, it is generally possible not to use FETs, but bipolar transistors in the phase modulator. When a phase modulator comprising bipolar transistors is used with a high carrier frequency in the range of 1–2 GHz, the differential amplifiers may fail to operate symmetrically. Such a drawback can effectively be eliminated by employing a BALUN according to the present invention to produce phase-modulated output signals that have the same amplitude as each other and are in opposite phase to each other even when the differential amplifiers do not operate symmetrically.

A phase modulator according to a second embodiment of the present invention will be described below.

Figure 9:
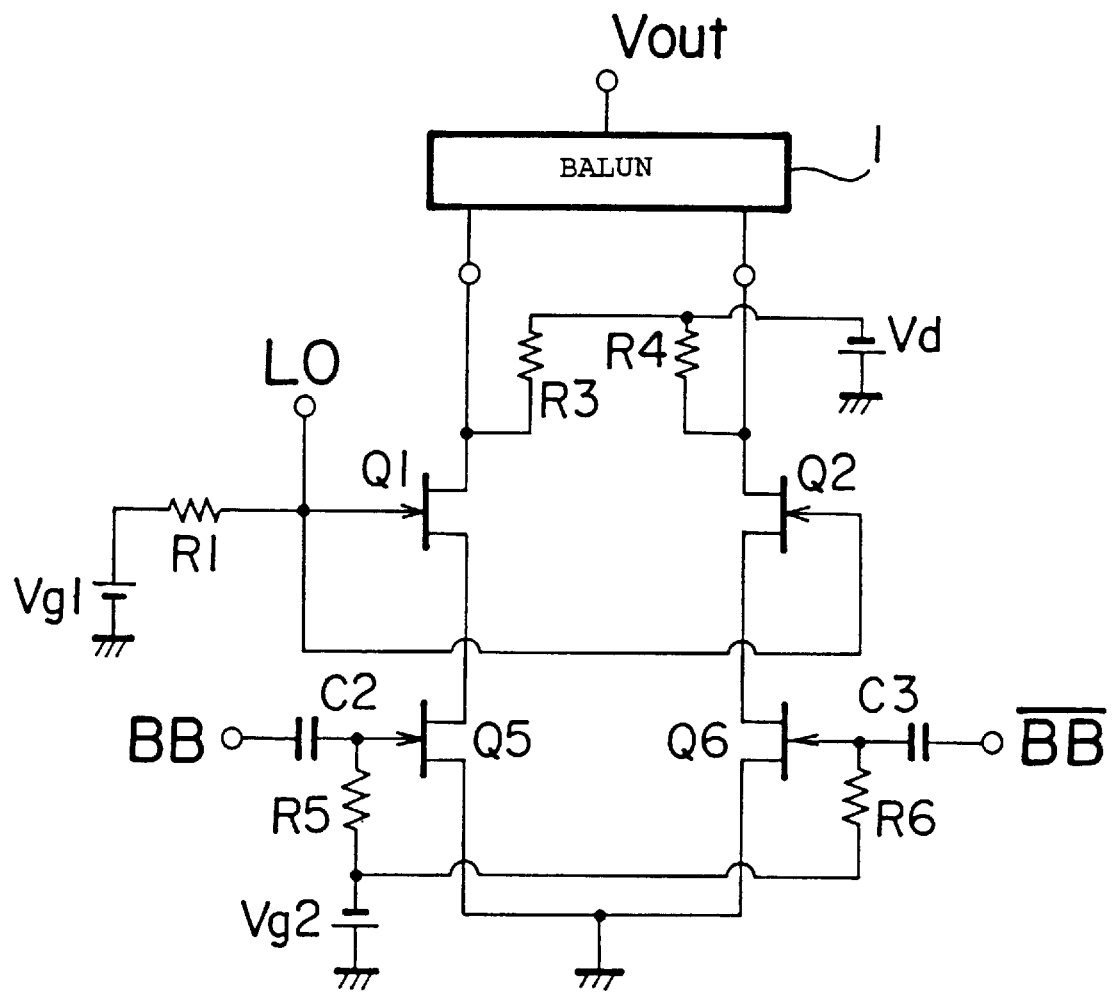
FIG. 9 is a circuit diagram of a detailed structure of a phase modulator according to a second embodiment of the present invention.

FIG. 9 shows the phase modulator according to the second embodiment of the present invention. The phase modulator according to the second embodiment is of basically the same arrangement as the phase modulator according to the first embodiment. Those parts shown in FIG. 9 which are identical to those of the first embodiment are denoted by identical reference numerals and representations, and will not be described in detail below.

According to the second embodiment, the FETs Q3, Q4 according to the first embodiment are dispensed with, and hence the capacitor C1 and the resistor R2 are also are dispensed with. Except these changes, the phase modulator according to the second embodiment is of the same arrangement as the phase modulator according to the first embodiment.

Figure 18:
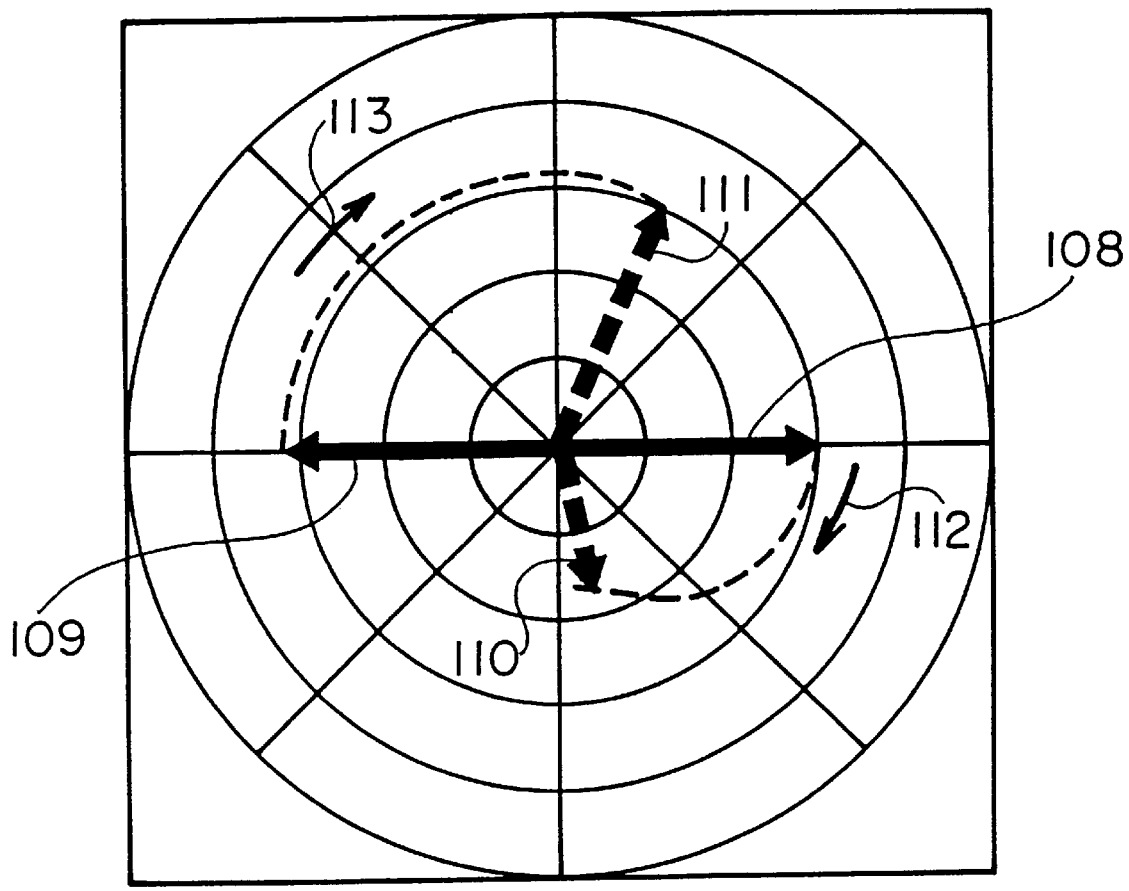
FIG. 18 is a polar coordinate graph showing the specific relationship of the vectors of the output signals Vout1, Vout2 with the frequency of a carrier signal as a parameter.

The amplitude of an output signal produced from one, whose gate is grounded, of the two FETs that make up a differential amplifier becomes smaller as the frequency of the carrier signal LO becomes higher than 0.1 GHz, as shown in FIG. 18. Therefore, when the phase modulator is used in frequency ranges from a microwave frequency band of several GHz to a millimeter wave band of several 10 GHz, no adverse effect will be imposed on the phase-modulated output signal Vout even if such an output signal is ignored. The phase modulator according to the second embodiment is constructed in view of such a fact, and has a simpler circuit arrangement.

Figure 10:
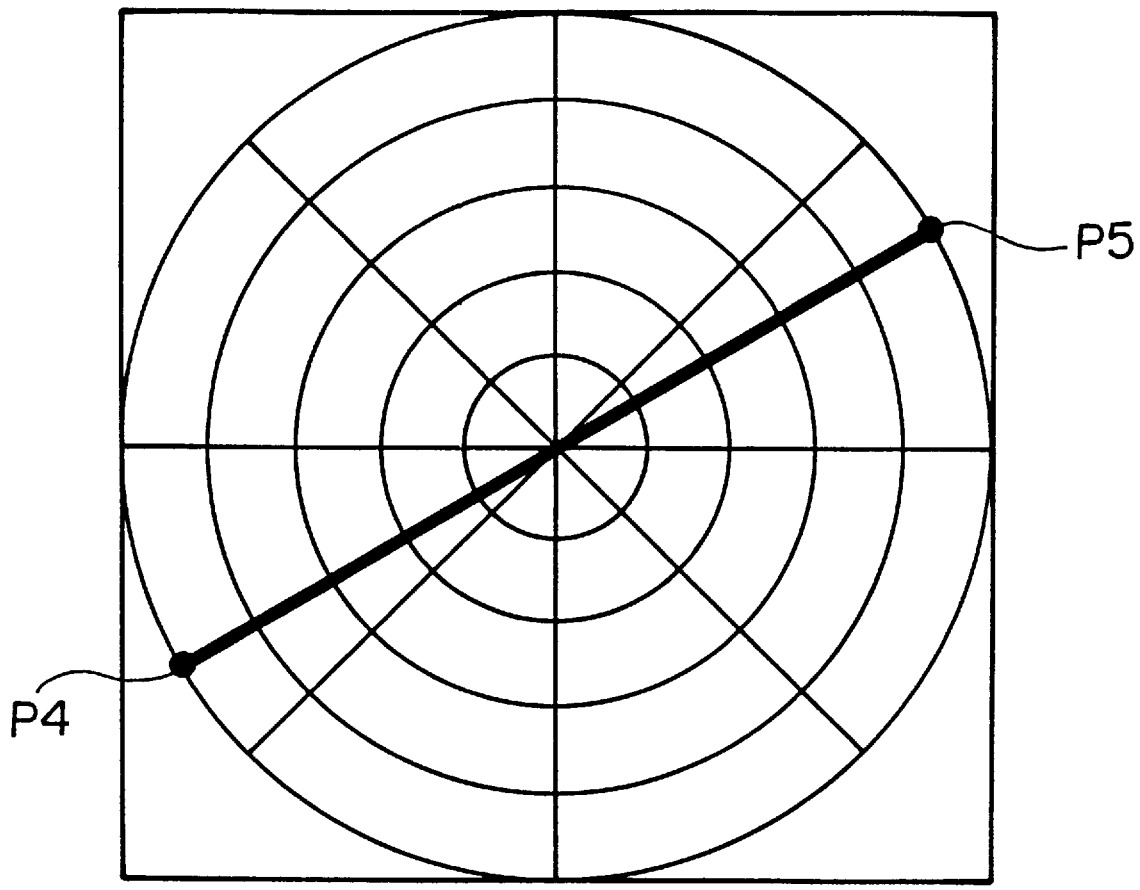
FIG. 10 is a polar coordinate diagram showing a simulated result of a phase-modulated output signal Vout of the phase modulator according to the second embodiment shown in FIG. 9.

FIG. 10 is a polar coordinate diagram showing a simulated result of the phase-modulated output signal Vout of the phase modulator according to the second embodiment shown in FIG. 9. In the simulation, the frequency of the carrier signal LO is set to 38 GHz, the drain bias signal Vd to 5 V, the gate bias voltage Vg1 to 2 V, the load resistors R3, R4 to 300Ω, the gate bias voltage Vg2 to –0.2 V, and the amplitude of the baseband signal BB to 0.4 V. A point P4 in FIG. 10 indicates the phase-modulated output signal Vout produced when the baseband signal BB has a voltage of 0 V and the reversal thereof has a voltage of –0.4 V. A point P5 in FIG. 10 indicates the phase-modulated output signal Vout produced when the baseband signal BB has a voltage of –0.4 V and the reversal thereof has a voltage of 0 V. As can be seen from FIG. 10, the phase-modulated output signal Vout produced when the baseband signal BB is of 0 V and the phase-modulated output signal Vout produced when the baseband signal BB is of –0.4 V have the same amplitude as each other and are in opposite phase to each other regardless of the fact that the frequency of the carrier signal LO is set to 38 GHz.

In the second embodiment, the FETs Q1, Q2, Q5, Q6 may be replaced with bipolar transistors. Specifically, if the phase modulator is used in a frequency range of 1–2 GHz or below, it is generally possible not to use FETs, but bipolar transistors in the phase modulator. When a phase modulator comprising bipolar transistors is used with a high carrier frequency in the range of 1–2 GHz, the differential amplifiers may fail to operate symmetrically. Such a drawback can effectively be eliminated according to the second embodiment of the present invention.

In the second embodiment, the phase modulator may be implemented in its entirety by an MMIC.

In the second embodiment, a constant-current power supply may be added to the phase modulator.

A phase modulator according to a third embodiment of the present invention will be described below.

Figure 11:
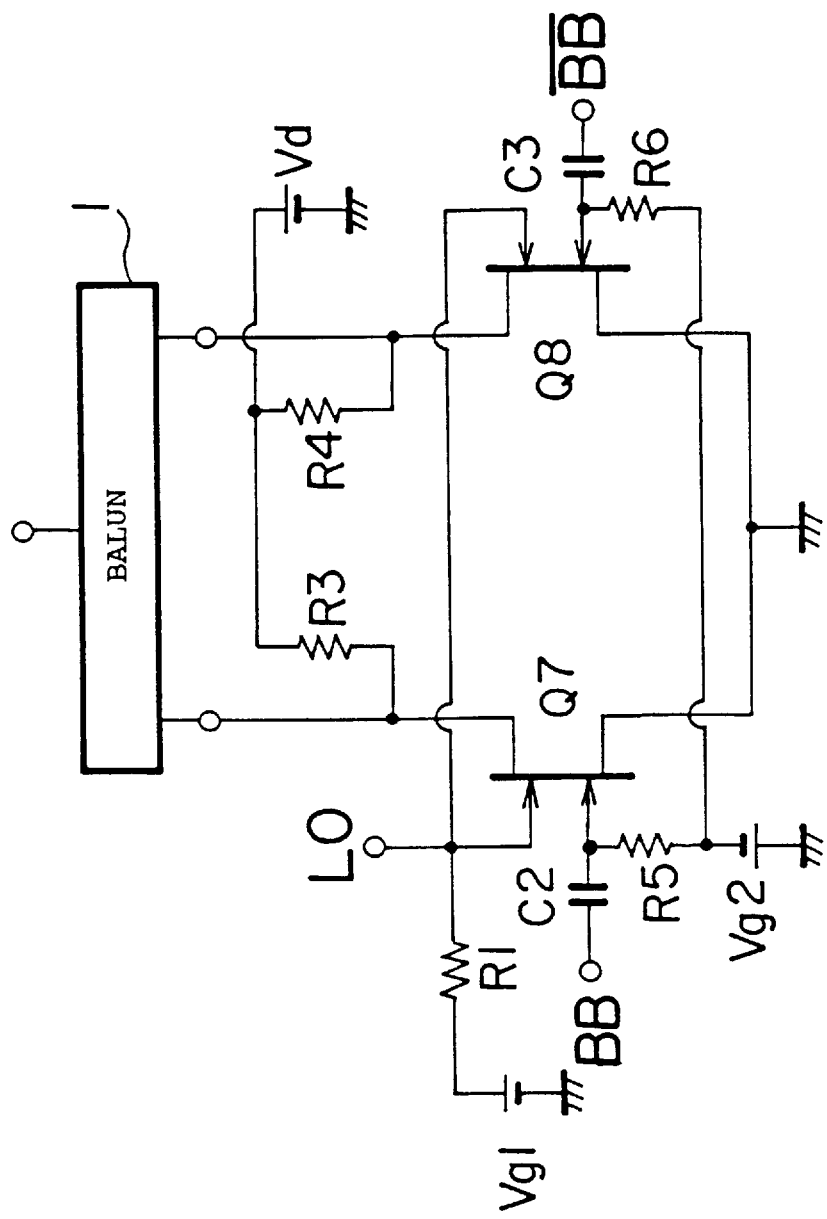
FIG. 11 is a circuit diagram of a detailed structure of a phase modulator according to a third embodiment of the present invention.

FIG. 11 shows the phase modulator according to the third embodiment of the present invention. The phase modulator according to third embodiment is of basically the same arrangement as the phase modulator according to the second embodiment. Those parts shown in FIG. 11 which are identical to those of the second embodiment are denoted by identical reference numerals and representations, and will not be described in detail below.

According to the third embodiment, the FETs Q1, Q5 in the second embodiment are replaced with a dual-gate FET Q7, and the FETs Q2, Q6 in the second embodiment are replaced with a dual-gate FET Q8. The phase modulator according to third embodiment operates in the same manner as the phase modulator according to the second embodiment.

In the third embodiment, the phase modulator may be implemented in its entirety by an MMIC.

In the third embodiment, a constant-current power supply may be added to the phase modulator.

A phase modulator according to a fourth embodiment of the present invention will be described below.

Figure 12:
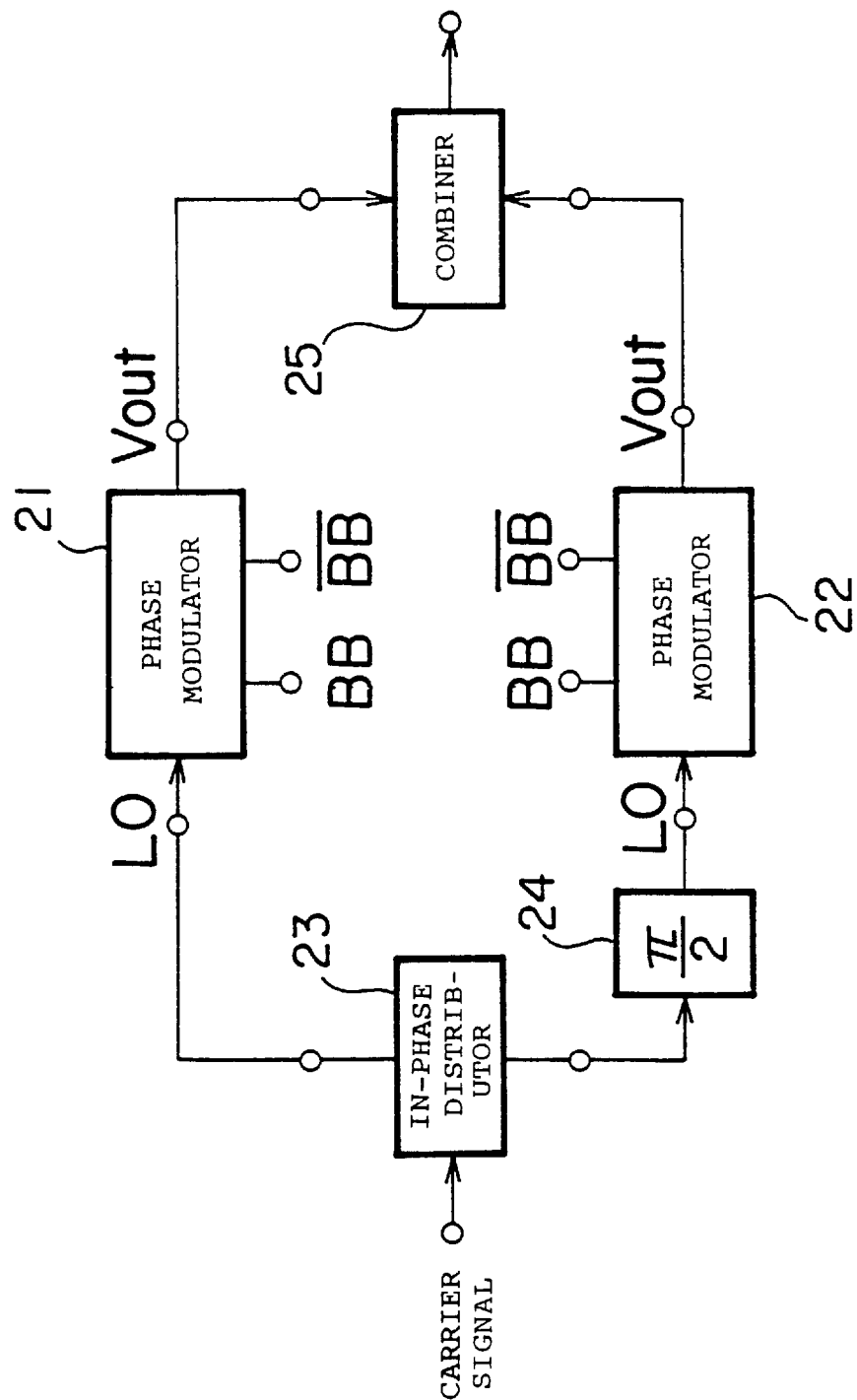
FIG. 12 is a block diagram of a detailed structure of a phase modulator according to a fourth embodiment of the present invention.

FIG. 12 shows the phase modulator according to the fourth embodiment of the present invention. The phase modulator according to the fourth embodiment comprises a quadrature phase modulator.

The phase modulator according to the fourth embodiment has two phase modulators 21, 22 each comprising one of the phase modulators according to the first, second, and third embodiments described above. The phase modulators 21, 22 should comprise the same phase modulator according to one of the first, second, and third embodiments. The baseband signal BB supplied to the phase modulator 21 and the baseband signal BB supplied to the phase modulator 22 are different from each other.

The carrier signal is divided into two carrier signals by an in-phase distributor 23. One of the two carrier signals is supplied as a carrier signal LO to the phase modulator 21, and the other carrier signal is supplied to a phase shifter 24. The phase shifter 24 delays the phase of the supplied carrier signal by π/2, and supplies the delayed carrier signal as a carrier signal LO to the phase modulator 22. The phase modulators 21, 22 produce respective phase-modulated output signals Vout, which are supplied to a combiner 25. The combiner 25 combines the supplied phase-modulated output signals Vout into a quadrature phase-modulated output signal, which is delivered to an external circuit.

The quadrature phase modulator according to the fourth embodiment may comprise phase modulators according to one of the first, second, and third embodiments of the present invention.

According to the present invention, as described above, two output signals from the Gilbert cell mixer are supplied to the input terminals of the balanced-to-unbalanced converter, and a phase-modulated output signal is obtained from the unbalanced output terminal of the balanced-to-unbalanced converter.

Consequently, it is possible to obtain phase-modulated output signals that are of the same amplitude as each other and are in opposite phase to each other even if the differential amplifiers do not operate symmetrically.

If the active elements comprise FETs, then the phase modulator can be used in frequency ranges from a microwave frequency band of several GHz to a millimeter wave band of several 10 GHz.

If the balanced-to-unbalanced converter comprises a planar circuit, then the phase modulator may be implemented by an MMIC. Consequently, the phase modulator can be reduced in size and manufactured inexpensively.

Inasmuch as the differential amplifiers do not need to operate symmetrically, no constant-voltage is required, and the power supply voltage for the phase modulator may be reduced by a voltage across a constant-current power supply which would otherwise be necessary.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A phase modulator for use in at least a microwave frequency band and a millimeter wave band, comprising:

first and second FETs having respective gates for being supplied with a carrier signal;

a third FET having a gate AC-coupled to ground, a drain connected to a drain of said second FET, and a source connected to a source of said first FET;

a fourth FET having a gate AC-coupled to ground, a drain connected to a drain of said first FET, and a source connected to a source of said second FET;

a fifth FET having a gate for being supplied with a baseband signal, a drain connected to the sources of said first and third FETs, and a source connected to ground;

a sixth FET having a gate for being supplied with a reversal of said baseband signal, a drain connected to the sources of said second and fourth FETs, and a source connected to ground; and a balanced-to-unbalanced converter for shifting, by $\pi/2$, the phase of one of an output signal produced from the drain of said first FET and an output signal produced from the drain of said second FET, combining the phase-shifted signal with the other output signal, and producing a combined output signal.

2. A phase modulator according to claim 1, wherein said balanced-to-unbalanced converter comprises a planar circuit, and said planar circuit and said first, second, third, fourth, fifth, and sixth FETs are implemented by a monolithic microwave integrated circuit.

3. A phase modulator according to claim 1, further comprising a constant-current power supply connected between the sources of said fifth and sixth FETs and ground.

4. A phase modulator for use in at least a microwave frequency band and a millimeter wave band, comprising:

first and second FETs having respective gates for being supplied with a carrier signal;

a third FET having a gate for being supplied with a baseband signal, a drain connected to a source of said first FET, and a source connected to ground;

a fourth FET having a gate for being supplied with a reversal of said baseband signal, a drain connected to the source of said second FET, and a source connected to ground; and a balanced-to-unbalanced converter for shifting, by $\pi/2$, the phase of one of an output signal produced from the drain of said first FET and an output signal produced from the drain of said second FET, combining the phase-shifted signal with the other output signal, and producing a combined output signal.

5. A phase modulator according to claim 4, wherein said balanced-to-unbalanced converter comprises a planar circuit, and said planar circuit and said first, second, third, and fourth FETs are implemented by a monolithic microwave integrated circuit.

6. A phase modulator according to claim 4, further comprising a constant-current power supply connected between the sources of said third and fourth FETs and ground.

7. A phase modulator for use in at least a microwave frequency band and a millimeter wave band, comprising:

a first dual-gate FET having a first gate for being supplied with a carrier signal, a second gate for being supplied with a baseband signal, and a source connected to ground;

a second dual-gate FET having a first gate for being supplied with said carrier signal, a second gate for being supplied with a reversal of said baseband signal, and a source connected to ground; and a balanced-to-unbalanced converter for shifting, by $\pi/2$, the phase of one of an output signal produced from the drain of said first dual-gate FET and an output signal produced from the drain of said second dual-gate FET, combining the phase-shifted signal with the other output signal, and producing a combined output signal.

8. A phase modulator according to claim 7, wherein said balanced-to-unbalanced converter comprises a planar circuit, and said planar circuit and said first and second dual-gate FETs are implemented by a monolithic microwave integrated circuit.

9. A phase modulator according to claim 7, further comprising a constant-current power supply connected between the sources of said first and second dual-gate FETs and ground.

10. A phase modulator comprising:

first and second bipolar transistors having respective bases for being supplied with a carrier signal;

a third bipolar transistor having a base AC-coupled to ground, a collector connected to a collector of said second bipolar transistor, and an emitter connected to an emitter of said first bipolar transistor;

a fourth bipolar transistor having a base AC-coupled to ground, a collector connected to a collector of said first bipolar transistor, and an emitter connected to an emitter of said second bipolar transistor;

a fifth bipolar transistor having a base for being supplied with a baseband signal, a collector connected to the emitters of said first and third bipolar transistors, and an emitter connected to ground;

a sixth bipolar transistor having a base for being supplied with a reversal of said baseband signal, a collector connected to the emitters of said second and fourth bipolar transistors, and an emitter connected to ground; and a balanced-to-unbalanced converter for shifting, by $\pi/2$, the phase of one of an output signal produced from the collector of said first bipolar transistor and an output signal produced from the collector of said second bipolar transistor, combining the phase-shifted signal with the other output signal, and producing a combined output signal.

11. A phase modulator comprising:

first and second bipolar transistors having respective bases for being supplied with a carrier signal;

a third bipolar transistor having a base for being supplied with a baseband signal, a collector connected to an emitter of said first bipolar transistor, and an emitter connected to ground;

a fourth bipolar transistor having a base for being supplied with a reversal of said baseband signal, a collector connected to an emitter of said second bipolar transistor, and an emitter connected to ground; and a balanced-to-unbalanced converter for shifting, by $\pi/2$, the phase of one of an output signal produced from a collector of said first bipolar transistor and an output signal produced from a collector of said second bipolar transistor, combining the phase-shifted signal with the other output signal, and producing a combined output signal.

12. A quadrature phase modulator for use in at least a microwave frequency band and a millimeter wave band, comprising:

a distributor for dividing a carrier signal into two carrier signals in phase with each other;

first and second FETs having respective gates for being supplied with one of said carrier signals from said distributor;

a third FET having a gate AC-coupled to ground, a drain connected to a drain of said second FET, and a source connected to a source of said first FET;

a fourth FET having a gate AC-coupled to ground, a drain connected to a drain of said first FET, and a source connected to a source of said second FET;

a fifth FET having a gate for being supplied with a first baseband signal, a drain connected to the sources of said first and third FETs, and a source connected to ground;

a sixth FET having a gate for being supplied with a reversal of said first baseband signal, a drain connected to the sources of said second and fourth FETs, and a source connected to ground;

a first balanced-to-unbalanced converter for shifting, by $\pi/2$, the phase of one of an output signal produced from the drain of said first FET and an output signal produced from the drain of said second FET, combining the phase-shifted signal with the other output signal, and producing a combined output signal;

a phase shifter for shifting, by $\pi/2$, the phase of the other carrier signal from said distributor;

seventh and eighth FETs having respective gates for being supplied with the carrier signal shifted in phase by said phase shifter;

a ninth FET having a gate AC-coupled to ground, a drain connected to a drain of said eighth FET, and a source connected to a source of said seventh FET;

a tenth FET having a gate AC-coupled to ground, a drain connected to a drain of said seventh FET, and a source connected to a source of said eighth FET;

an eleventh FET having a gate for being supplied with a second baseband signal, a drain connected to the sources of said seventh and ninth FETs, and a source connected to ground;

a twelfth FET having a gate for being supplied with a reversal of said second baseband signal, a drain connected to the sources of said eighth and tenth FETs, and a source connected to ground;

a second balanced-to-unbalanced converter for shifting, by $\pi/2$, the phase of one of an output signal produced from the drain of said seventh FET and an output signal produced from the drain of said eighth FET, combining the phase-shifted signal with the other output signal, and producing a combined output signal; and a combiner for combining the output signal from said first balanced-to-unbalanced converter and the output signal from said second balanced-to-unbalanced converter into a quadrature phase-modulated output signal.

13. A quadrature phase modulator for use in at least a microwave frequency band and a millimeter wave band, comprising:

a distributor for dividing a carrier signal into two carrier signals in phase with each other;

first and second FETs having respective gates for being supplied with one of said carrier signals from said distributor;

a third FET having a gate for being supplied with a first baseband signal, a drain connected to a source of said first FET, and a source connected to ground;

a fourth FET having a gate for being supplied with a reversal of said first baseband signal, a drain connected to a source of said second FET, and a source connected to ground;

a first balanced-to-unbalanced converter for shifting, by $\pi/2$, the phase of one of an output signal produced from a drain of said first FET and an output signal produced from a drain of said second FET, combining the phase-shifted signal with the other output signal, and producing a combined output signal;

a phase shifter for shifting, by $\pi/2$, the phase of the other carrier signal from said distributor;

fifth and sixth FETs having respective gates for being supplied with the carrier signal shifted in phase by said phase shifter;

a seventh FET having a gate for being supplied with a second baseband signal, a drain connected to a source of said fifth FET, and a source connected to ground;

an eighth FET having a gate for being supplied with a reversal of said second baseband signal, a drain connected to a source of said sixth FET, and a source connected to ground;

a second balanced-to-unbalanced converter for shifting, by $\pi/2$, the phase of one of an output signal produced from a drain of said fifth FET and an output signal produced from a drain of said sixth FET, combining the phase-shifted signal with the other output signal, and producing a combined output signal; and a combiner for combining the output signal from said first balanced-to-unbalanced converter and the output signal from said second balanced-to-unbalanced converter into a quadrature phase-modulated output signal.

14. A quadrature phase modulator for use in at least a microwave frequency band and a millimeter wave band, comprising:

a distributor for dividing a carrier signal into two carrier signals in phase with each other;

a first dual-gate FET having a first gate for being supplied with one of said carrier signals from said distributor, a second gate for being supplied with a first baseband signal, and a source connected to ground;

a second dual-gate FET having a first gate for being supplied with said one of said carrier signals, a second gate for being supplied with a reversal of said first baseband signal, and a source connected to ground;

a first balanced-to-unbalanced converter for shifting, by $\pi/2$, the phase of one of an output signal produced from a drain of said first dual-gate FET and an output signal produced from a drain of said second dual-gate FET, combining the phase-shifted signal with the other output signal, and producing a combined output signal;

a phase shifter for shifting, by $\pi/2$, the phase of the other carrier signal from said distributor;

a third dual-gate FET having a first gate for being supplied with the carrier signal shifted in phase by said phase shifter, a second gate for being supplied with a second baseband signal, and a source connected to ground;

a fourth dual-gate FET having a first gate for being supplied with the carrier signal shifted in phase by said phase shifter, a second gate for being supplied with a reversal of said second baseband signal, and a source connected to ground;

a second balanced-to-unbalanced converter for shifting, by $\pi/2$, the phase of one of an output signal produced from a drain of said third dual-gate FET and an output signal produced from a drain of said fourth dual-gate FET, combining the phase-shifted signal with the other output signal, and producing a combined output signal; and a combiner for combining the output signal from said first balanced-to-unbalanced converter and the output signal from said second balanced-to-unbalanced converter into a quadrature phase-modulated output signal.

* * * * *